United States Patent
Blanchard et al.

(12) 
(10) Patent No.: US 6,300,034 B1
(45) Date of Patent: Oct. 9, 2001

(54) PROCESSING METHOD AND APPARATUS FOR IMAGED ELEMENTS

(75) Inventors: Simon John Blanchard; Malcolm Bryan Gwilt, both of Harrogate (GB)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/407,900

(22) Filed: Sep. 29, 1999

(30) Foreign Application Priority Data

Sep. 30, 1998 (GB) ................................................ 9821178

(51) Int. Cl.⁷ .............................. G03F 7/07; G03C 8/32; G03D 3/04; G03D 3/06; G03D 9/00
(52) U.S. Cl. ...................... 430/204; 430/403; 396/573; 396/582; 396/587; 396/626; 396/627; 396/628
(58) Field of Search .................................. 430/204, 403; 396/582, 587, 573, 626, 627, 628

(56) References Cited

U.S. PATENT DOCUMENTS

| | | | |
|---|---|---|---|
| 4,490,030 | * | 12/1984 | Acklin et al. .......................... 396/626 |
| 5,116,721 | * | 5/1992 | Yamamoto ............................ 396/627 |
| 5,795,697 | * | 8/1998 | Coppens et al. ...................... 430/204 |
| 5,834,156 | * | 11/1998 | Urasaki et al. ........................ 430/204 |
| 5,861,236 | * | 1/1999 | Verlinden et al. .................... 396/626 |
| 5,903,795 | * | 5/1999 | Piccinino et al. ..................... 396/627 |

* cited by examiner

*Primary Examiner*—Richard L. Schilling
(74) *Attorney, Agent, or Firm*—Breiner & Breiner, L.L.C.

(57) ABSTRACT

An apparatus is provided for processing an imaged element comprising a support, an image-receiving layer and a silver halide emulsion layer. The apparatus comprises a tank for holding a processing liquid, driving means for propelling the imaged element through the tank, guide means for directing the path of the imaged element through the tank and developer circulation means for promoting circulation of the processing liquid in the tank. The circulation means includes flow control means to provide substantially fresh processing liquid to the surface of the imaged element and to disperse exhausted processing liquid present at the surface of the element, thereby eliminating the difficulties associated with local developer exhaustion and ensuring that consistently high image quality is maintained across the whole area of the imaged element.

18 Claims, 2 Drawing Sheets

Slotted feed bar

Typical slot size and arrangement

PROCESSING METHOD AND APPARATUS FOR IMAGED ELEMENTS

FIELD OF THE INVENTION

The present invention relates to a method and apparatus for processing imaged elements; in particular, it is concerned with the processing of presensitised plate precursors in order to produce lithographic printing plates. More specifically, the invention is associated with a method for the processing of a presensitised plate precursor comprising a substrate having coated thereon a light sensitive layer including a silver halide emulsion, whereby improved image quality and press performance may be achieved by the elimination of localised developer exhaustion which can occur during processing. The invention also provides an apparatus for the performance of said method.

Silver halides are used for imaging applications in a number of ways. Particularly suitable coatings include those based on the silver complex diffusion transfer- or DTR-process, the principles of which have been fully described in U.S Pat. No. 2,352,014 and in the publication "Photographic Silver Halide Diffusion Processes" by Andre Rott and Edith Weyde, The Focal Press, London and New York, 1972.

In the DTR process, the unexposed silver halide in an information-wise exposed silver halide emulsion layer is transformed, by treatment with a so-called silver halide solvent, into soluble silver complex compounds which are allowed to diffuse into an image receiving element and are reduced therein by means of a developing agent, generally in the presence of physical development nuclei, to form a metallic silver image having reversed image density values ("DTR image") with respect to the black silver image obtained in the exposed areas of the photographic material. A DTR image-bearing material produced in this way may be used as a planographic printing plate wherein the DTR silver image areas form water-repellent, ink-receptive image areas on a water-receptive, ink-repellent background.

Two different types of DTR system are available. A two-sheet DTR system includes a first element comprising a photographic silver halide emulsion material and a separate image-receiving second element, generally containing a physical development nuclei layer; after forming an image in the image-receiving element, the two elements are placed in contact in the presence of one or more developing agents and one or more silver halide solvents in the presence of an alkaline processing liquid, and subsequently peeled apart, to provide a metallic silver layer in the second element. A single sheet DTR system comprises a single element including a silver halide emulsion layer which is integral, and in water permeable relationship, with an image-receiving layer, which again generally includes a physical development nuclei layer. Following exposure, the element is treated with one or more developing agents and one or more silver halide solvents in the presence of an alkaline processing liquid in order to provide a metallic silver layer in the image-receiving layer. The present invention is concerned with the latter type of DTR system.

Single sheet DTR systems are themselves provided in two alternative versions. U.S Pat. No. 4,722,535 and British Patent No. 1241661 describe a system wherein a support is provided on its surface with a silver halide emulsion layer, over which is provided an image-receiving layer including physical development nuclei; following information-wise exposure, and subsequent development, the imaged element may be used as a printing plate without removal of the spent emulsion layer. Alternatively, a DTR system may comprise a support provided on its surface with an image-receiving layer including physical development nuclei, over which is provided a silver halide emulsion layer; after information-wise exposure, and subsequent development, the imaged element is washed with water to remove the spent emulsion layer, to leave a support carrying a silver image which may then be utilised as a printing plate. Lithographic printing plates produced from the latter type of system are disclosed in European Patents Nos. 131462, 278766 and 410500.

The present invention is concerned with the means of processing imaged elements—in particular, printing plate precursors—based on the latter type of single sheet DTR system, in which the image-receiving layer, containing physical development nuclei, is in direct contact with the support. For printing applications, the support in such a system typically comprises aluminium which has preferably been grained and anodised on one surface in order to improve its lithographic characteristics. Whilst systems of this type are particularly suitable for printing applications, however, the method of processing of the systems is found to be critical to the subsequent performance of the printing plates obtained.

During the processing stages, the areas of an imaged element exposed to actinic radiation undergo a process known as chemical development. Said process involves the conversion of exposed silver halide grains into filamentary metallic silver by the action of a reducing agent dissolved in the developer solution. Typically, the reducing agent—otherwise referred to as a developing agent—comprises hydroquinone which is provided in aqueous alkaline solution. The reduction process may be represented schematically by the following equation:

$$2AgX + H_2Q + 2OH^- = 2Ag + Q + 2X^- + 2H_2O \qquad [1]$$

where $H_2Q$ is hydroquinone and X is chloride, bromide or iodide, or any combination thereof.

By contrast, in the unexposed areas the silver halide crystals are complexed by a silver halide solvent, which is typically a simple inorganic salt such as sodium thiosulphate. The resulting complex then diffuses to the nucleation surface which, in the case of a single sheet DTR system in which the image-receiving layer is in direct contact with the support, comprises a substrate surface onto which has been coated a nucleating layer; said nucleating layer typically comprises a colloidal metal or metal sulphide. Reduction then takes place by the action of a reducing agent which, again, is typically supplied in the form of an alkaline solution of hydroquinone. This process is generally referred to as physical development and results in the production of a form of silver which can successfully accept lithographic ink for subsequent printing applications. The physical development process can be schematically represented by the following equations:

$$AgX + 2S_2O_3^{2-} = [Ag(S_2O_3)_2]^{3-} + X^- \qquad [2]$$

$$2[Ag(S_2O_3)_2]^{3-} + H_2Q + 2OH^- = 2Ag + Q + 4S_2O_3^{2-} + 2H_2O \qquad [3]$$

where the symbols have the meanings previously ascribed.

The conditions of processing, including pH, temperature and concentration of reducing agent, are chosen such that the chemical development process is essentially complete within 2 or 3 seconds of the moment at which the exposed parts of the plate come into contact with the developer, whilst the time taken for completion of the physical development process can be in the region of 30–45 seconds. Thus, during the course of the development process, it is possible for a small, isolated image area, or an unexposed area which is surrounded by a large exposed or background area, of the imaged element to experience a localised rapid depletion of reducing (developing) agent, and a fall in the alkalinity of the developing solution in the area surrounding the small, isolated image. Such local exhaustion of developer would occur within a time period of only 2–3 seconds and, therefore, before the physical development process had effectively commenced.

In addition to the rapid depletion of active ingredients in the developing solution, the situation would be exacerbated by the fact that a build-up of halide would occur in the exhausted developer, this having a potentially deleterious effect on the mode of formation of silver during the physical development process. Hence, the rapid local increase in the concentration of exhausted developer may impair the formation of the small isolated image and, consequently, it is necessary to rapidly remove the substantially exhausted, or over-exhausted, developer and ensure its replacement by fresher developer in order to allow the physical development process, which is vital to the effective operation of the plate on press, to proceed to completion without such impairment. Thus, the present invention seeks to provide an apparatus and method for the processing of an imaged element which can ensure efficient circulation of the processing solution, thereby facilitating completion of the development process.

Apparatus for the processing of lithographic printing plate precursors is generally designed for the processing of conventional plate precursors. Such precursors are commonly based on diazo or quinone diazide chemistries, wherein an increase or decrease in the solubility of the coating in a processing developer is effected by exposure of the coating to actinic radiation. In such cases, therefore, and unlike the processing of DTR plate precursors, the developer does not give rise to any chemical reaction during the development step, but is effective simply by solubilising, and thereby dissolving away, background non-image areas. Thus, automatic processing of conventional plate precursors is generally achieved quite simply, by dipping the exposed precursor in a tank of developer, allowing the coating to dissolve in the background areas and leave an imaged lithographic plate having a clean background. If necessary, scrubbing means may be provided in order to assist in the dissolution of the unwanted coating in the non-image areas.

Not surprisingly, therefore, processing apparatus used for the processing of conventional lithographic printing plate precursors is not suitable for use in the processing of DTR printing plate precursors, where maintenance of the chemical reactivity of the developer in direct contact with the surface of the plate precursor is required. Various attempts to overcome these shortcomings by means of the application of thin layers of developer to the surface of an imagewise exposed DTR printing plate precursor in a controlled manner have generally proved unsuccessful. Thus, for example, European Patent No. 593854 discloses several embodiments of developing apparatus wherein a layer of developer is applied to a DTR plate precursor as it moves through an automatic processor. However, such techniques require careful control of parameters such as developer flow and temperature and, consequently, are generally not robust enough for routine use in a commercial pre-press operation. Furthermore, the methods are not suited to the frequent changes of plate size which are often encountered in such situations.

Accordingly, it is an object of the present invention to provide a means by which an imaged DTR element may be efficiently processed at the development stage, so as to eliminate the difficulties associated with localised developer exhaustion, thereby facilitating completion of the physical development process and ensuring inconsistencies in image quality are avoided such that high image quality is maintained across the whole area of the imaged element.

Furthermore, it is a particular object of the present invention to provide a method and apparatus whereby the above objectives may be achieved when the said imaged DTR element comprises a lithographic printing plate precursor.

According to a first aspect of the present invention, there is provided an apparatus for processing an imaged element comprising a support, an image receiving layer and a silver halide emulsion layer, said apparatus comprising a tank for holding processing liquid, driving means for propelling said imaged element through said tank, guide means for directing the path of said imaged element through said tank and developer circulation means for promoting circulation of said processing liquid in said tank, wherein said circulation means includes flow control means to provide substantially fresh processing liquid to the surface of said imaged element and to disperse exhausted processing liquid present at the surface of said imaged element.

Preferably, said imaged element comprises a lithographic printing plate precursor and said support comprises grained and anodised aluminium.

The flow control means may comprise a spray or plurality of sprays. A suitable arrangement would involve the use of specifically designed spray nozzles of a type commonly used to apply liquids to a sheet or web of material. Such nozzles would typically form a wide spray of liquid which would overlap with adjacent spray nozzles. Most preferably, however, the flow control means comprises a slot feed or a plurality of slot feeds, in particular a slotted feed bar. Many different arrangements of slots in such a feed bar are possible. For example, the slots may be arranged along a centre line axis of the bar or, alternatively, they may be rotated at an angle to said centre line so that a herringbone pattern is formed, wherein an increased degree of overlap between slots may be achieved, which can result in improvements in both application of developer and agitation of exhausted developer overlying the plate. Essentially, it is possible to use any arrangement of slots or holes which is capable of providing thorough and even agitation of the developer in the immediate vicinity of the plate, and many such possibilities would be available to those skilled in the art. In any event, however, said flow control means is provided below the surface of the processing liquid in the tank.

The circulation means ensures that the imaged element is constantly refreshed, via the flow control means, with processing liquid from the main body of liquid in the tank during its passage through said liquid. Said liquid may be wholly recycled from said main body of liquid, thereby allowing usage of processing liquid to be kept to a minimum. Alternatively, the processing liquid may be partly or wholly obtained from a fresh supply of the liquid, or from a specifically formulated replenisher.

Since the flow control means is positioned below the surface of the processing liquid, oxidation effects—which are associated with open designs whereby processing liquids are applied by devices situated above the surface of the main body of said liquid—are eliminated. Furthermore, difficulties associated with blockage of the slots or sprays—resulting from drying out of the processing liquid in said areas in prior art processors—do not arise, and control of developer flow is less critical than in many prior art methods in which a precise quantity of liquid is required to be externally applied to the imaged element.

In a preferred embodiment, the circulation means in the apparatus of the first aspect of the present invention is provided by means of a pump which operates in conjunction with a feed bar containing slotted holes.

Typically, the tank comprised in the said apparatus has a volume of from 5 to 75 liters, allowing for the use of a relatively large volume of processing solution. Thus, it is possible to maintain both temperature and concentration at more or less constant values, and the processing liquid flowing from the slots or sprays to the surface of the imaged element is in an essentially equilibrium state in terms of the values of these parameters relating to the reactive ingredients.

Preferably, the driving means for propelling the imaged element through the tank comprises driven rollers which are preferably arranged in pairs, the element being fed through the pair of rollers. Most preferably, the driving means comprises two sets of driven rollers, the first set being sited at the entrance to the tank and serving as input rollers, and the second set being placed at the exit from the tank and acting as output rollers.

Suitable guide means for directing the path of the imaged element through the tank include guide rollers, past which the said element is fed, or guide plates, over or under which the said element is able to pass. Most conveniently, a combination of one or more guide rollers and a guide plate may be employed to efficiently direct the path of the element.

According to a second aspect of the present invention, there is provided a method for processing an imaged element comprising a support, an image-receiving layer and a silver halide emulsion layer, said method comprising:
(i) information-wise exposing the imaged element; and
(ii) processing the exposed element through a processing liquid contained in an apparatus according to the first aspect of the invention, thereby to ensure efficient processing of the said element.

The apparatus and method of the invention will now be illustrated, though without limitation, by reference to the accompanying drawings, in which:

FIG. 1 is a schematic representation of a plate processor according to the present invention; and FIG. 2 is a schematic representation of a slotted feed bar which may be used as a flow control means in accordance with the present invention.

Referring firstly to FIG. 1, the processor comprises a developer tank (8), at the entrance to which is sited a pair of input driven rollers (1) and at the exit from which is fitted a pair of output driven rollers (2). The tank is fitted with two guide rollers (3A) and (3B) and a guide plate (6), above which is a trough of developer (4) in which is located a slotted feed bar or spray bar (5) which serves as the flow control means. Circulation of the developer solution is promoted by the action of the circulation pump (7). In use, an imaged element of the type previously herein described is fed, with the exposed side face upwards, between the driven input rollers (1), being guided by the first guide roller (3A) into the trough of developer (4) lying above the guide plate (6). The said element then passes under the second guide roller (3B), still immersed in the developer, and finally leaves the tank (8) through the set of driven exit rollers (2). During the passage of the said element, efficient circulation of the developer liquid is maintained by the use of the circulation pump (7), which removes developer from the body of the liquid in the tank (8) and pumps it to the slotted feed bar or spray bar (5), and thence into the trough of developer (4).

For ease of illustration, the said feed bar (5) is shown as being located in the centre of the apparatus, but this should not be taken as limiting, and satisfactory results may be obtained by positioning the bar at any point within the trough of developer (4). Advantageously, however, maximum effectiveness in agitating the localised exhausted developer lying over the imaged element may be achieved by positioning the feed bar (5) at, or close to, the centre of the trough of developer (4).

The rate at which developer is pumped by the said circulation pump (7) is largely dictated by the dimensions of the system. Of particular significance in this regard are the size of the development tank (8) and the length of the slotted feed bar or spray bar (5), as well as the size and number of the feed slots or spray holes in the said bar; also of relevance is the depth of the developer in the trough (4). The pump rate is selected to produce a flow which achieves maximum efficiency of processing, and typical values lie between 5 and 50 liters per minute, most typically between 15 and 30 liters per minute.

A particular embodiment of the slotted feed bar (5) may be seen by reference to FIG. 2, in which the slots run along either side of a centre line axis of the feed bar, being offset by approximately 5 mm, and show a measure of overlap which may be in the range of from 0 to 5 mm. The illustrated feed bar has an external width of 22 mm and an internal width of 19 mm; the slots are of length 100 mm and width 0.5 mm. However, as previously stated, the embodiment shown in FIG. 2 should not be seen as limiting the design, size or arrangement of the feed slots in such a feed bar.

For simplicity of illustration, it is shown in FIG. 2 that the feed of developer into the feed bar is from one end—specifically the right end—of the bar. It will be understood that the developer feed could equally well be introduced at the opposite end, or at both ends, or from the centre of or, indeed, from any other section of the bar. Similarly, the square cross-sectional shape of the feed bar as illustrated in FIGS. 1 and 2 does not preclude the use of bars of other cross-sectional design, for example those having rectangular, circular or oval cross-sections.

The processing liquid which is present in the apparatus according to the first aspect of the present invention, for use in the method of the second aspect of the present invention, comprises at least one development agent and at least one silver halide solvent in combination with an aqueous alkaline developing solution. Optionally, the processing liquid may also contain other components, such as development accelerators, oxidation preservatives (e.g. sodium sulphite), calcium sequestering agents, anti-sludge agents, antifoggants, thickening agents and compounds which release bromide ions.

Suitable developing agents for use in accordance with the method of the present invention include hydroquinone derivatives in combination with secondary developing agents. Typically, the hydroquinone compound may be hydroquinone, methylhydroquinone or chlorohydroquinone. Suitable secondary developing agents include p-N-methylaminophenol and, in particular, 1-phenyl-3-pyrazolidone and its derivatives, such as 4-methyl-1-phenyl-3-pyrazolidone, 4,4-dimethyl-1-phenyl-3-pyrazolidone, 4-hydroxymethyl-4-methyl-1-phenyl-3-pyrazolidone and 4-methyl-1-tolyl-3-pyrazolidone.

The preferred silver halide solvent, which acts as a complexing agent for the silver halide, is sodium thiosulphate pentahydrate, which is present in the processing liquid at a level of 5 to 150 g/l, preferably 10 to 80 g/l. Other suitable silver halide solvents include ammonium thiosulphate, potassium thiosulphate, various thiocyanates, polythioethers as disclosed in U.S. Pat. No. 5,200,294, meso-ionic compounds as disclosed in European Patent No. 554585, cyclic imides and thiosalicylates, as disclosed in U.S. Pat. Nos. 4,297,430 and 2,857,276. Combinations of different silver halide solvents may be employed in the processing liquid and, in addition, it is possible to include at least one silver halide solvent in the processing liquid whilst also incorporating at least one silver halide solvent in a suitable layer of the printing plate precursor.

The processing liquid preferably contains amines or alkanolamine derivatives which serve both as silver halide solvents and as development accelerators. Suitable compounds include 2-amino-2-methyl-1-propanol, 2-amino-2-methyl-1,3-propanediol, 2-amino-2-ethyl-1,3-propanediol, tris(hydroxymethyl)aminomethane, 2-amino-2-ethyl-1-propanol, ethanolamine, 1-amino-2-propanol, diethanolamine, 2-methylaminoethanol, triethanolamine, and N,N-diethylaminoethanol.

The aqueous alkaline developing solution may include a variety of alkaline materials, including sodium hydroxide, potassium hydroxide, alkali metal salts of phosphoric and/or silicic acid such as trisodium phosphate or sodium metasilicate, or sodium carbonate. Regeneration of the developer solution is possible by use of any standard techniques, as would be apparent to the skilled person.

The support material used for the lithographic printing plate precursor employed in conjunction with the present invention comprises aluminium, which may either be pure aluminium or may comprise an aluminium alloy, the aluminium content of which is at least 95%. The thickness of this support generally ranges from about 0.13 mm to about 0.5 mm. Alternatively, it is possible to employ a laminate of aluminium with paper or a plastic material. The aluminium supports are preferably grained and anodised according to standard techniques known in the art and described, for example, in U.S. Pat. No. 3,861,917. Most preferably, the grained and anodised aluminium support is produced according to the specification disclosed in European Patent No. 278766.

The image-receiving layer of the lithographic printing plate precursor preferably comprises colloidal silver nuclei, which have been prepared according to the Carey Lea method, at a coating weight of between 0.05 and 10.0 mg/m$^2$, typically between 0.2 and 4.0 mg/m$^2$. Other colloidal nuclei which may be used include the sulphides of heavy metals such as silver or palladium. The colloidal nuclei are optionally dispersed in a binder, for example gelatin or other suitable polymer such as a polyacrylate salt.

The silver halide emulsion layer of the printing plate precursor may comprise any photosensitive silver halide emulsion comprising a hydrophilic colloid binder. The photosensitive silver halide may comprise silver chloride, silver bromide, silver bromoiodide, silver chlorobromide, or the like, or any combinations thereof. In order to achieve a sufficiently high rate of dissolution of the silver halide and a satisfactory gradation for lithographic purposes, a silver halide emulsion mainly comprising silver chloride is generally used. However, it is preferred that the emulsion should include a minimum of 10% silver bromide, in order to ensure that adequate stability on grained and anodised aluminium is obtained. The silver halide emulsion may comprise either coarse or fine grained material and is prepared by any of the standard techniques known in the art. Optionally, the emulsion may be chemically and spectrally sensitised. Details concerning the composition, preparation and coating of silver halide emulsions may be gleaned from the Product Licensing Index, Volume 92, December 1971, Publication 9232.

The silver halide emulsion necessarily includes a binder, which is a hydrophilic colloid, generally a protein, and preferably gelatin. Gelatin may, however, be replaced in part by any of a range of suitable synthetic, semi-synthetic or natural polymers. In addition, the emulsion may also contain various other ingredients, such as antifogging agents, developing agents, development accelerators, wetting agents, stabilisers, acutance dyes and pigments, and matting agents.

Whilst, in view of their high photosensitivity, the use of negative working silver halide emulsions is preferred, direct positive silver halide emulsions that produce a positive silver image in the emulsion layer and a negative silver image on the aluminium support may also be employed.

Optionally, an intermediate water-swellable layer may be present between the image-receiving layer and the silver halide emulsion layer. Suitable materials for this purpose are disclosed in European Patent No. 483415.

After passage through the said developing stage, a silver image is formed in the layer of physical development nuclei on the base. However, an excess of processing solution may still be present on the plate. Removal of this excess of liquid may be conveniently effected by guiding the plate through a pair of squeezing rollers. The silver image obtained is exposed by washing off all the layers above the layer containing the physical development nuclei; this may be most simply achieved by the use of water, the temperature of which is not critical, but is preferably between 30° and 40° C. Advantageously, the wash water contains an enzyme which is capable of degrading gelatin. The use of a scrubbing action for this wash-off stage is also desirable.

When the resulting element is a printing plate, comprising a silver image on an aluminium base, it may subsequently be subjected to a chemical after-treatment designed to increase the hydrophilicity of the background areas, whilst also improving the oleophilicity of the silver image. This chemical treatment preferably involves the use of a lithographic fixer or finisher; typical examples of such compositions are disclosed in European Patent No. 131462.

Following treatment with a fixer or finisher, the plate comprising a silver image on an aluminium support, is ready for use as a printing plate on a printing press.

The invention will now be further illustrated, though without limitation, by reference to the following experiments:

EXPERIMENT 1

An SLT-N processor made and supplied by Agfa-Gevaert was fitted as in FIG. 1 with a slotted feed bar of the type shown in FIG. 2. A commercially available grained and anodised DTR printing plate (Silverlith® SDB from Agfa-Gevaert) measuring 650×550 mm was exposed in contact through a film positive on a print-down frame to a tungsten light source. The film positive comprised images of circular dots 3 mm in diameter and spaced at regular intervals of 4 cm across the width of the plate and 7 cm along the length of the film positive. After exposure, the plate was processed with the shorter edge leading through the processor under the manufacturer's recommended conditions of operation and with unused developer. This was the control plate. Secondly, another plate was exposed in the same manner and processed under the same conditions but now the processor was fitted with a slotted feed bar, as described and illustrated in FIGS. 1 and 2, with a flow rate of approximately 18 l/min. After processing through the SLT-N auto-processor, which included the steps of washing and finisher application after the development stage, the plates were rinsed with fresh water and wiped with a cotton wool swab to remove any residual debris or loosely bonded silver from the imaged 3 mm dots. The amount of silver in each 3 mm dot was then determined using a calibrated XRF counter to give a result for silver weight expressed as gm/m². The 3 mm dots from the length-wise middle section of each plate from the leading edge of the plate to the trailing edge, with reference to the side which entered the processor first (the leading edge), are shown in the table below for plates with the developer feed bar operating and those without the feed bar of the invention.

|  | Leading edge dot #1 | dot #2 | dot #3 | dot #4 | dot #5 | dot #6 | Trailing edge dot #7 |
|---|---|---|---|---|---|---|---|
| Silver weight (gm/m²) without developer feed bar | 0.88 | 083 | 0.79 | 0.83 | 0.63 | 0.58 | 0.56 |
| Silver weight (gm/m²) with developer feed bar | 0.95 | 0.91 | 0.90 | 0.94 | 0.94 | 0.90 | 0.94 |

As can be seen, the silver weights are higher and more consistent for the plate processed through the apparatus with the feed bar of the invention than for the equivalent plate processed without the feed bar. A higher silver weight will generally give a longer press run, and, because the plate with the feed bar is more consistent, the plate will provide a more consistent press run when used on a lithographic printing press. The drop in weight of the silver image as the plate moves through the trough of developer is indicative of a build-up of exhausted developer lying over the plate surface, thereby restraining the amount of silver image deposited. Thus, the dots at the leading edge of the plate only come into contact with substantially unused developer, but the dots towards the trailing edge of the plate come into contact with progressively more exhausted developer and, consequently, suffer a progressive loss in image weight. By replenishing the surface with substantially unused developer, and by dispersing locally exhausted developer back into the bulk of the developer by means of the feed bar, the silver deposition is high and consistent along the length of the plate.

EXPERIMENT 2

A 40% 175 lpi tint image was produced over the whole surface of a commercially available Silverlith® SDB plate measuring 724×615 mm by means of exposure to a Cymbolics PlateJet laser platesetter. The thus exposed plates were processed as above, with and without the developer feed bar, and also with unused developer and developer that had been used for processing an equivalent of 6 m² of plate per liter of developer. After processing and finishing with the manufacturer's recommended chemicals, the plates were separately loaded onto a Heidelberg SORM-Z sheet fed offset press and prints were made from the tint image on the plate. After several impressions, the print was examined for evidence of image wear and loss of the tint pattern. The following results were recorded.

|  | Number of impressions before loss of image is noticed | | |
|---|---|---|---|
|  | leading edge of plate | centre of plate | trailing edge of plate |
| #1 unused developer without feed bar | 5000* | 4000 | 2000 |
| #2 unused developer with feed bar | 10000* | 10000* | 10000* |
| #3 used developer without feed bar | 3000 | 500 | 100 |
| #4 used developer with feed bar | 5000 | 5000 | 5000 |

*tint pattern in these areas is unaffected; press run stopped at this point as having demonstrated the improvement due to the apparatus and method of the invention.

Plate #1 shows that, whilst the leading edge of the plate shows good press performance, the trailing edge soon shows signs of image loss. Plate #2 with the feed bar shows much better plate print performance. This can be explained by the feed bar providing nearly fresh developer to the surface of the plate as it passes through the trough of developer and by dispersing the locally exhausted developer away from the plate surface.

Similarly, with what would be considered used developer not suitable for making printing plates, a dramatic improvement in the press performance is observed when the feed bar is used.

Both examples illustrate the improvements to the image strength and/or deposition weight, and the improved press performance when the developer feed bar is used, in accordance with particularly preferred embodiments of the apparatus and method of the present invention.

Figure 1:
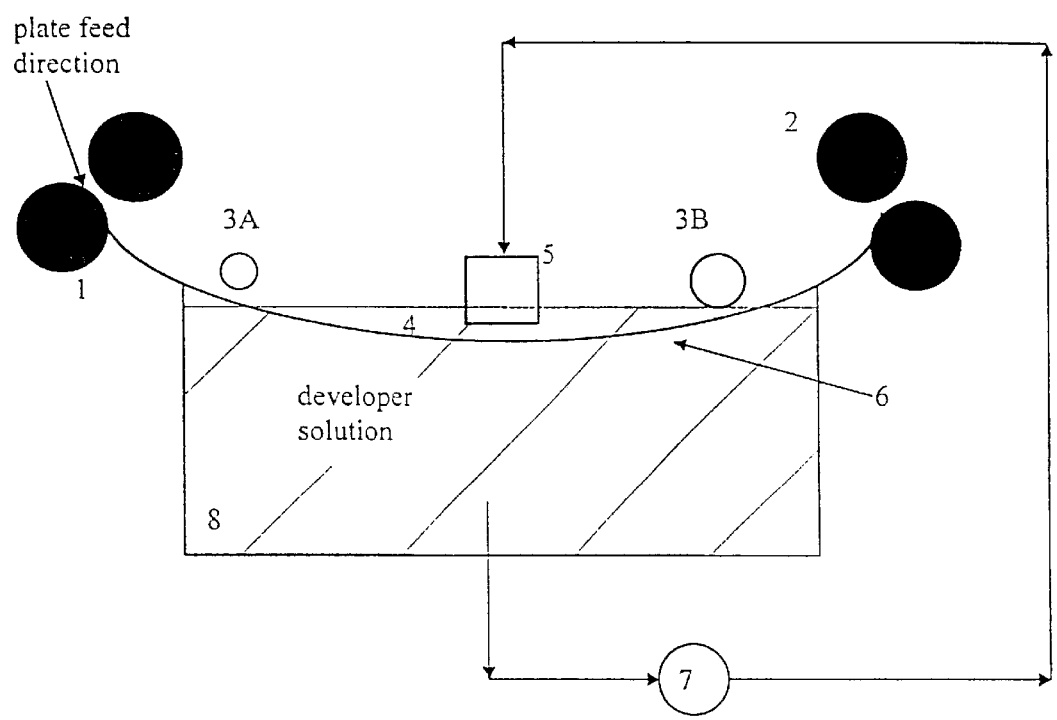
FIG. 1
1. Input Driven Rollers
2. Output Driven Rollers
3. Guide Rollers
4. Trough of Developer solution
5. Slotted Feed Bar or Spray Bar
6. Guide Plate
7. Circulation Pump
8. Main Body of Developer Tank
FIG. 2
Diagram of Developer Feed Slot
Figure 2:
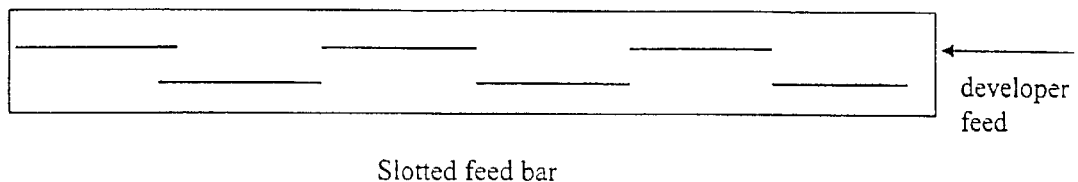
Figure 2:
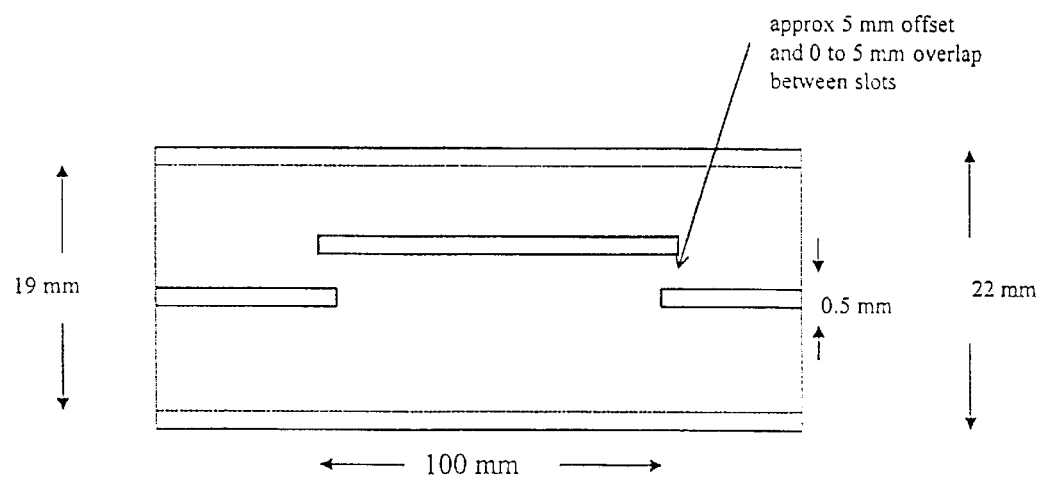

What is claimed is:
1. An apparatus for processing an imaged element comprising a lithographic printing plate precursor which comprises a grained and anodized aluminium support, an image-receiving layer and a silver halide emulsion layer, said apparatus comprising a tank for holding a processing liquid, driving means for propelling said imaged element through said tank, guide means for directing the path of said imaged element through said tank, and developer circulation means for promoting circulation of said processing liquid in said tank, wherein said driving means comprises driven rollers arranged in pairs and said circulation means includes flow control means to provide substantially fresh processing liquid to the surface of said imaged element and to disperse exhausted processing liquid present at the surface of said imaged element, said flow control means comprising a slotted feed bar which is provided below the surface of the processing liquid in said tank.

2. An apparatus as defined in claim 1 wherein said circulation means comprises a pump.

3. An apparatus as defined in claim 1 wherein said driving means comprises two sets of driven rollers sited at the entrance to and the exit from said tank.

4. An apparatus as defined in claim 1 wherein said guide means include guide rollers or guide plates.

5. An apparatus as defined in claim 4 wherein said guide means comprises a combination of at least one guide roller and a guide plate.

6. A method for processing a lithographic printing plate precursor comprising a grained and anodized aluminium support, an image-receiving layer and a silver halide emulsion layer, said method comprising:

(i) information-wise exposing the plate precursor; and (ii) processing the exposed precursor through a processing liquid contained in an apparatus to ensure efficient processing of the said precursor, wherein said apparatus comprises a tank for holding a processing liquid, driving means for propelling said precursor through said tank, guide means for directing the path of said precursor through said tank, and developer circulation means for promoting circulation of said processing liquid in said tank, wherein said circulation means includes flow control means to provide substantially fresh processing liquid to the surface of said precursor and to disperse exhausted processing liquid present at the surface of said precursor, said flow control means comprising a slotted feed bar which is provided below the surface of the processing liquid in said tank.

7. A method as defined in claim 6 wherein said circulation means comprises a pump.

8. A method as defined in claim 6 wherein said driving means comprises driven rollers arranged in pairs.

9. A method defined in claim 6 wherein said driving means comprises two sets of driven rollers sited at the entrance to and the exit from said tank.

10. A method as defined in claim 6 wherein said guide means include guide rollers or guide plates.

11. A method as defined in claim 6 wherein said guide means comprises a combination of at least one guide roller and a guide plate.

12. A method as defined in claims 6, 7, 8, 9, 10 or 11 wherein said processing liquid comprises an aqueous alkaline solution including at least one development agent and at least one silver halide solvent.

13. A method as defined in claim 12 wherein said developing agent comprises a hydroquinone derivative in combination with a secondary developing agent.

14. A method as defined in claim 13 wherein said secondary developing agent comprises 1-phenyl-3-pyrazolidone or a derivative thereof.

15. A method as defined in claim 12 wherein said silver halide solvent comprises sodium thiosulphate pentahydrate.

16. A method as defined in claim 6, 7, 8, 9, 10 or 11 wherein said processing liquid additionally includes amines or alkanolamine derivatives.

17. An apparatus for processing an imaged element comprising a lithographic printing plate precursor comprising a grained and anodized aluminum support, an image-receiving layer and a silver halide emulsion layer, said apparatus comprising a tank for holding a processing liquid, driving means for propelling said imaged element through said tank, guide means for directing the path of said imaged element through said tank, and developer circulation means for promoting circulation of said processing liquid in said tank, wherein said guide means comprises a combination of at least one guide roller and a guide plate and said circulation means includes flow control means to provide substantially fresh processing liquid to the surface of said imaged element and to disperse exhausted processing liquid present at the surface of said imaged element, said flow control means comprising a slotted feed bar which is provided below the surface of the processing liquid in said tank.

18. An apparatus as defined in claim 17 wherein said circulation means comprises a pump.

* * * * *